(12) United States Patent
Farrow et al.

(10) Patent No.: US 7,009,844 B2
(45) Date of Patent: Mar. 7, 2006

(54) WIRE FORM HEAT SINK RETENTION MODULE

(75) Inventors: Timothy Samuel Farrow, Apex, NC (US); Dean Frederick Herring, Youngsville, NC (US); William Fred Martin-Otto, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 81 days.

(21) Appl. No.: 10/871,661

(22) Filed: Jun. 18, 2004

(65) Prior Publication Data

US 2005/0280999 A1    Dec. 22, 2005

(51) Int. Cl.
*H05K 7/20* (2006.01)

(52) U.S. Cl. .............. 361/704; 361/709; 257/718; 257/719; 257/727; 165/80.3; 165/185; 24/458; 24/513

(58) Field of Classification Search .......... 361/704, 361/709, 719; 257/706, 712, 718, 719, 727; 165/80.3, 185; 174/16.3; 24/510, 513
See application file for complete search history.

(56) References Cited

U.S. PATENT DOCUMENTS

| | | | | |
|---|---|---|---|---|
| 5,477,916 A | * | 12/1995 | Lin | 165/80.3 |
| 6,219,241 B1 | * | 4/2001 | Jones | 361/704 |
| 6,280,222 B1 | | 8/2001 | Walkup | |
| 6,344,971 B1 | * | 2/2002 | Ju | 361/704 |
| 6,473,306 B1 | * | 10/2002 | Koseki et al. | 361/704 |
| 6,501,657 B1 | | 12/2002 | Carr | |
| 6,707,672 B1 | * | 3/2004 | Liu | 361/704 |
| 6,785,136 B1 | * | 8/2004 | Chang et al. | 361/704 |
| 6,822,869 B1 | * | 11/2004 | Huang et al. | 361/704 |
| 6,905,357 B1 | * | 6/2005 | Ma | 439/331 |
| 6,934,157 B1 | * | 8/2005 | Figuerado et al. | 361/704 |
| 2005/0117306 A1 | * | 6/2005 | Lee et al. | 361/719 |

* cited by examiner

*Primary Examiner*—Boris Chérvinsky
(74) *Attorney, Agent, or Firm*—Martin J. McKinley; Dillon & Yudell LLP

(57) ABSTRACT

A retention module firmly secures a heat sink for a computer chip. The retention module is oriented about the computer chip on a circuit board. The retention module has a rotatable wire form that has two loops. When the rotatable wire form is rotated, the two loops press against an impingement shelf on the heat sink, forcing the heat sink against the retention module and the computer chip. The two loops are angularly offset to each other, thus compensating for torsion lag between the two loops when the two loops are pressed against the impingement shelf.

9 Claims, 7 Drawing Sheets

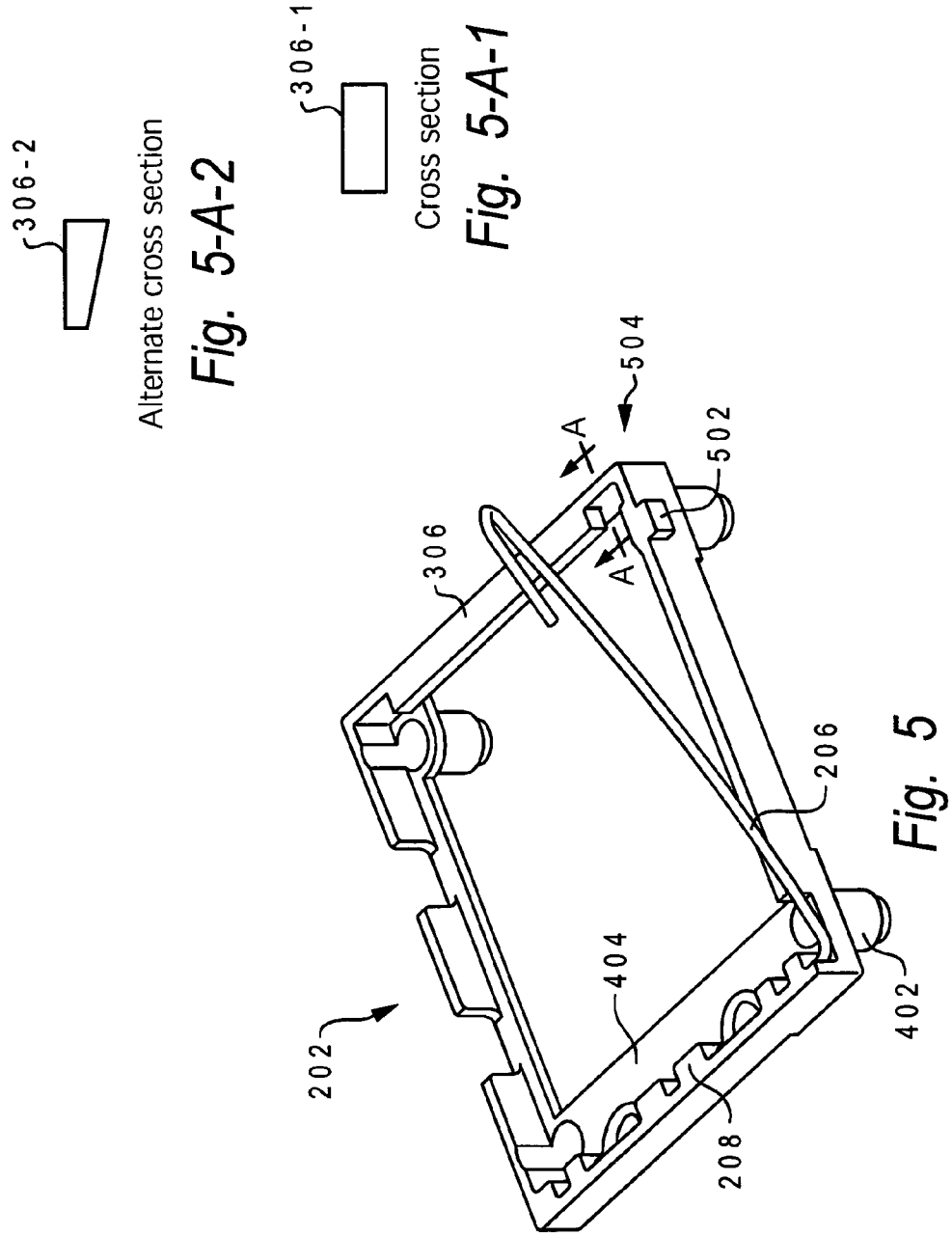

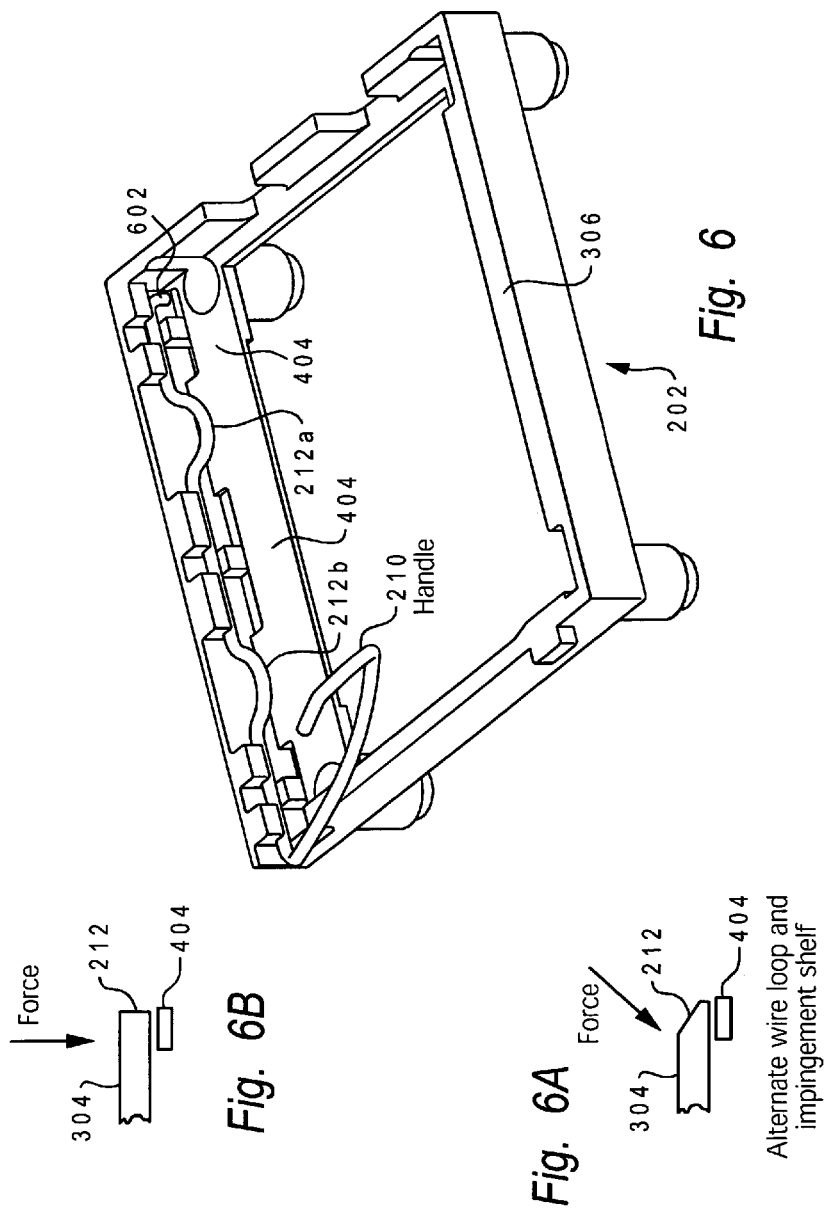

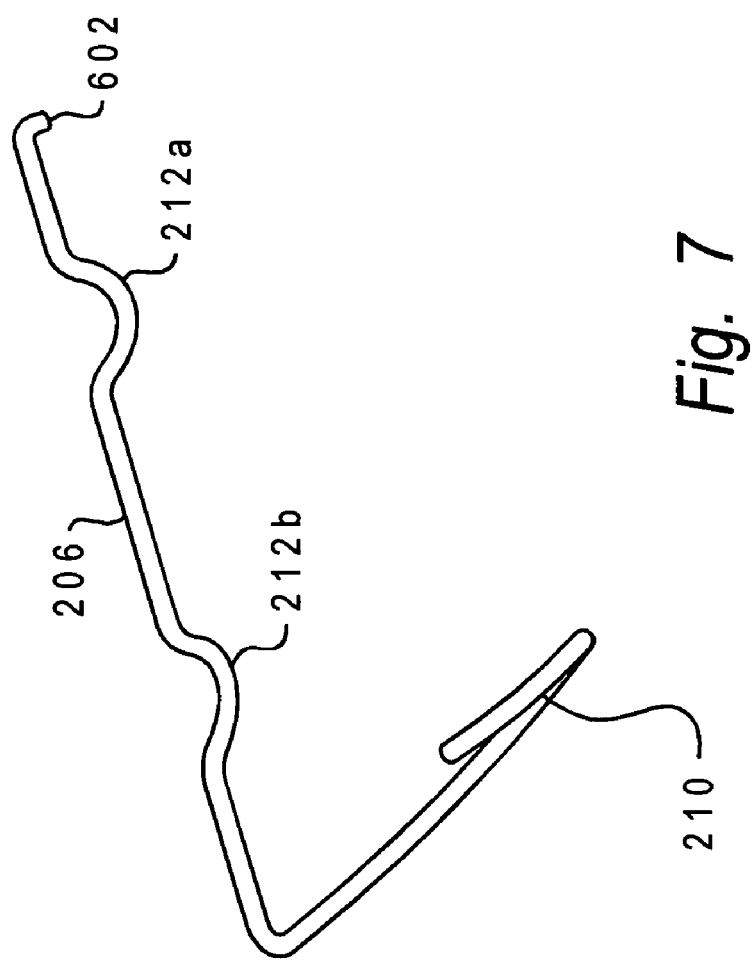

WIRE FORM HEAT SINK RETENTION MODULE

BACKGROUND OF THE INVENTION

1. Technical Field

The present invention relates in general to the field of electronics, and in particular to electronic chips that generate extraneous heat during normal operation. More particularly, the present invention relates to a method and system for securing a heat sink against a heat generating circuit package, which still more particularly may be a computer chip.

2. Description of the Related Art

In a typical personal computer (PC), the main heat-generating component among the logic circuits is the processor, also referred to as the Central Processing Unit (CPU) or microprocessor (MP). As illustrated in FIG. 1, a processor 102 is mounted in a socket 104, which is mounted on a (printed) circuit board 106 by mating pins 108 from the processor 102 into the socket 104. As processors continue to grow in performance, so does the heat generated by the processors. To remove heat from processor 102, a heat sink (HS) 110, having a HS base 112 and a plurality of fins 114, is secured to processor 102 by a strap 116. Heat is conducted from the processor 102 to the HS base 112 and the fins 114, which dissipate heat by conduction and convection to ambient air surrounding fins 114. To provide thermal conduction between the processor 102 and the HS base 112, thermal grease 118, typically a thermally conductive silicon or filled hydrocarbon grease doped with fillings such as metals, is used.

A major drawback to the heat sink mounting scheme shown in FIG. 1 is that to secure and remove strap 116 requires tools and is time consuming. Furthermore, to break a suction bond caused by thermal grease 118 requires a firm grip on fins 114, which may be hot, thus causing a technician to burn her fingers.

What is needed therefore is a device that permits easy installation and removal of heat sink 110, preferably without the use of tools, against a processor 102, while still providing a secure contact between the top of processor 102 and the bottom of HS base 112.

SUMMARY OF THE INVENTION

The present invention is therefore directed to a retention module for a heat sink. The retention module is oriented about a computer chip on a circuit board. The retention module has a rotatable wire form that has two loops. When the rotatable wire form is rotated, the two loops press against an impingement shelf on the heat sink, forcing the heat sink against the retention module and the computer chip. The two loops are angularly offset to each other, thus compensating for torsion lag between the two loops when the two loops are pressed against the impingement shelf.

The above, as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further purposes and advantages thereof, will best be understood by reference to the following detailed description of an illustrative embodiment when read in conjunction with the accompanying drawings, where:

FIG. 5 depicts additional detail of the retention module and alternate embodiments of a capture shelf that secures the heat sink t the retention module;

FIG. 6 illustrates additional detail of a wire form loop coupled to the retention module and alternate embodiments of a heat sink impingement shelf; and FIG. 7 depicts additional detail of the wire form loop.

DETAILED DESCRIPTION OF A PREFERRED EMBODIMENT

Figure 1:
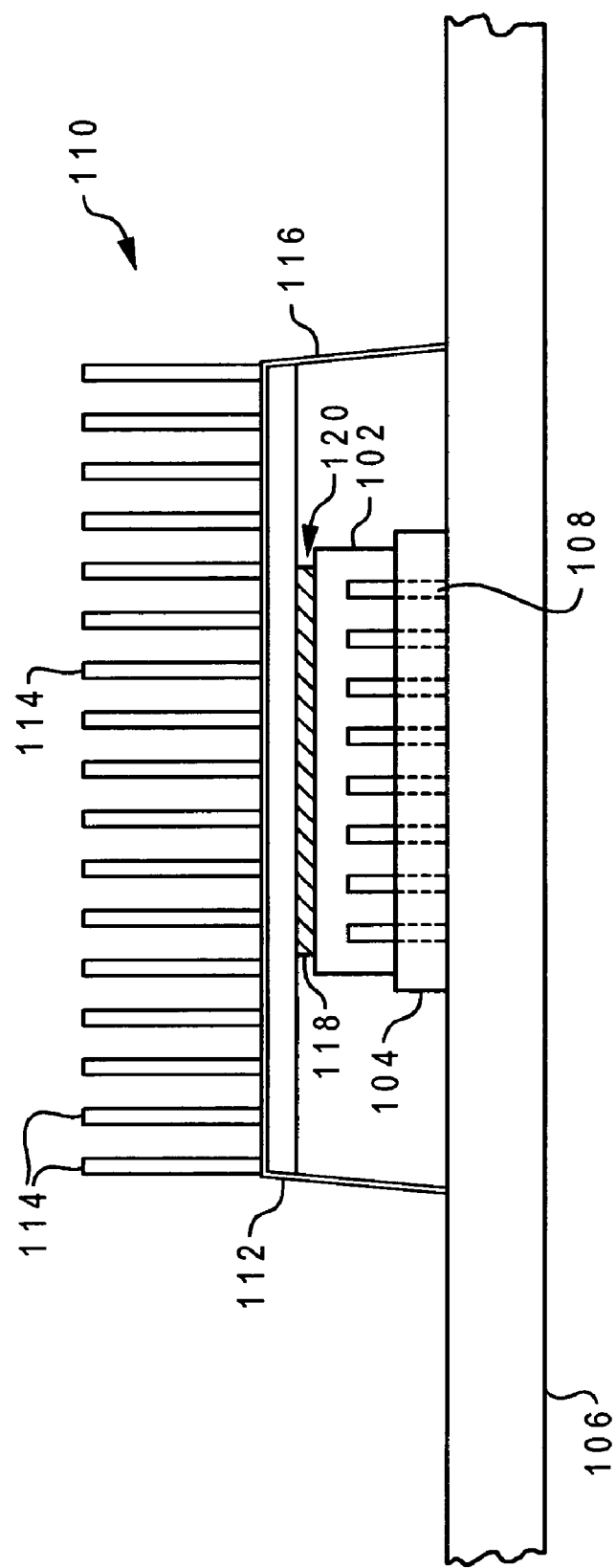
FIG. 1 depicts a prior art mounting of a processor using a strap to mate a heat sink with a chip.
Figure 2:
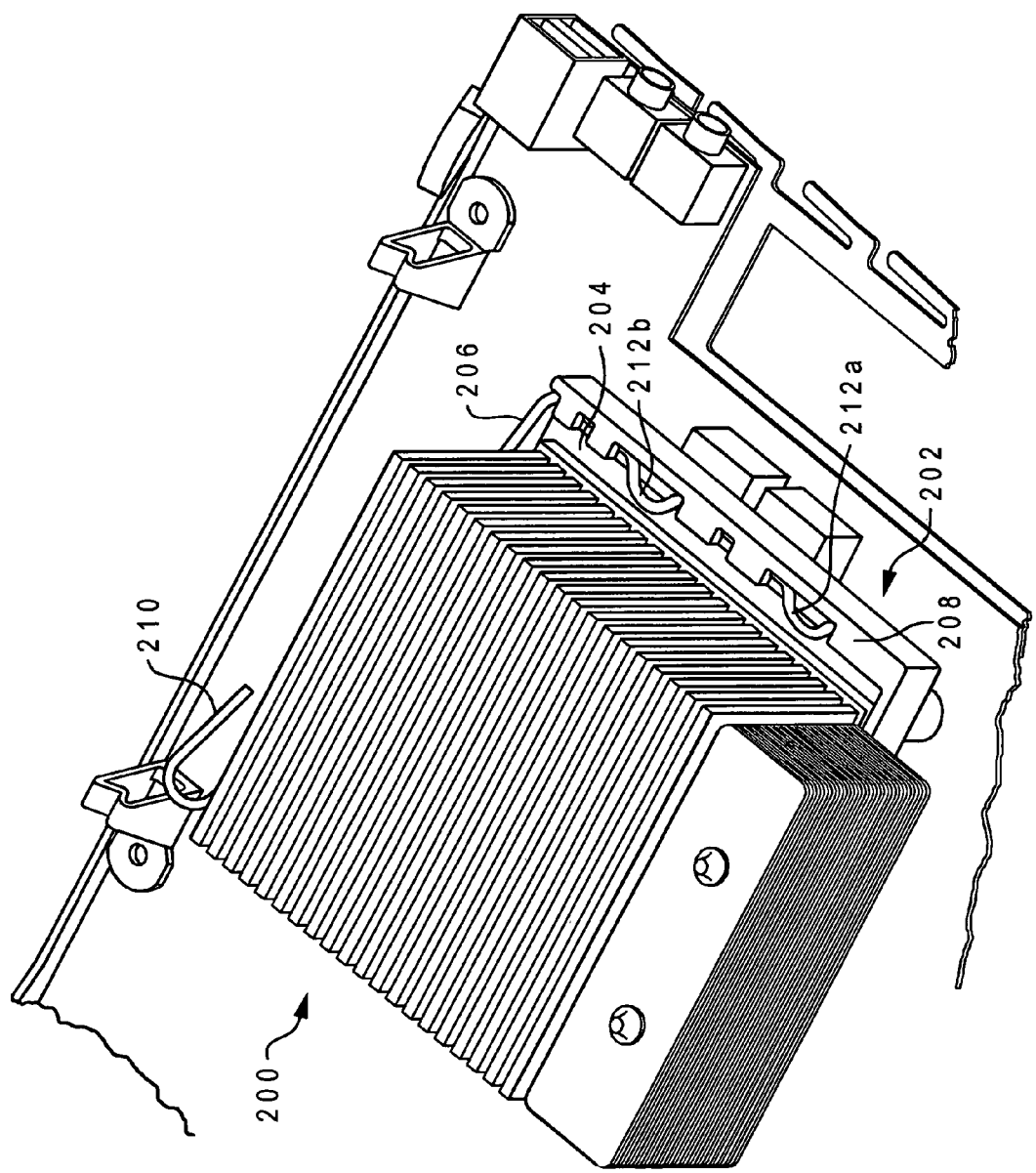
FIG. 2 illustrates the heat sink mounted in the inventive retention module.

With reference now to FIG. 2, there is depicted a heat sink 200 resting on but not locked to a retention module 202. At a first end, heat sink 200 has a heat sink impingement shelf 204 which rests on retention module 202, as shown in detail in FIG. 4 below. Retention module 202 includes a rotatable wire form 206 that is secured but freely rotatable within wire form retainment 208. Rotatable wire form 206 has a handle 210, whose purpose and function is described in subsequent figures. Rotatable wire form 206 has multiple loops, preferably a wire form first loop 212a and a wire form second loop 212b, such that the wire form second loop 212b is proximal to handle 210 and wire form first loop 212a is distal to handle 210.

In FIG. 2, rotatable wire form 206 is shown in the middle of a rotation. That is, handle 210 is not pressed all the way down, and thus wire form first loop 212a and wire form second loop 212b are not pressing against heat sink impingement shelf 204. Thus, heat sink 200 is not locked down when rotatable wire form 206 is in the position shown in FIG. 2. However, heat sink 200 is secured within retention module 202 at the end opposite heat sink impingement shelf 204 in a manner described below with reference to FIG. 3.

Figure 3:
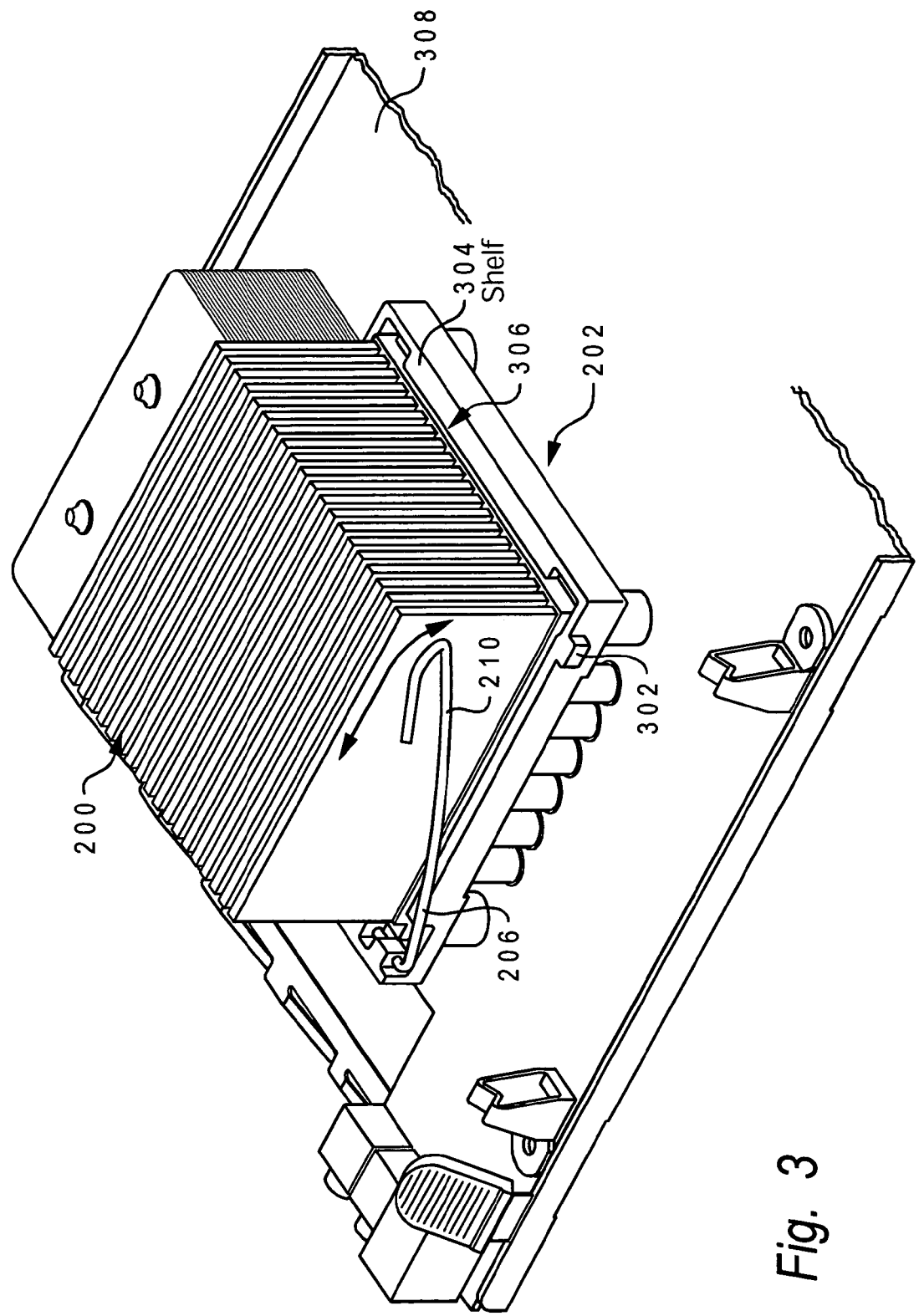
FIG. 3 depicts additional detail of the a handle for locking the heat sink to the retention module.

With reference now to FIG. 3, a second view of rotatable wire form 206, heat sink 200 and retention module 202 is shown. As noted above, handle 210 has not been rotated down completely, and thus is not yet locked under a wire form handle lock stud 302. However, note that a heat sink impingement shelf 304 (part of heat sink 200) has been slid under a capture shelf 306 (part of retention module 202). Note also that retention module 202 is mounted on a circuit board 308, as described further in FIG. 4.

Figure 4:
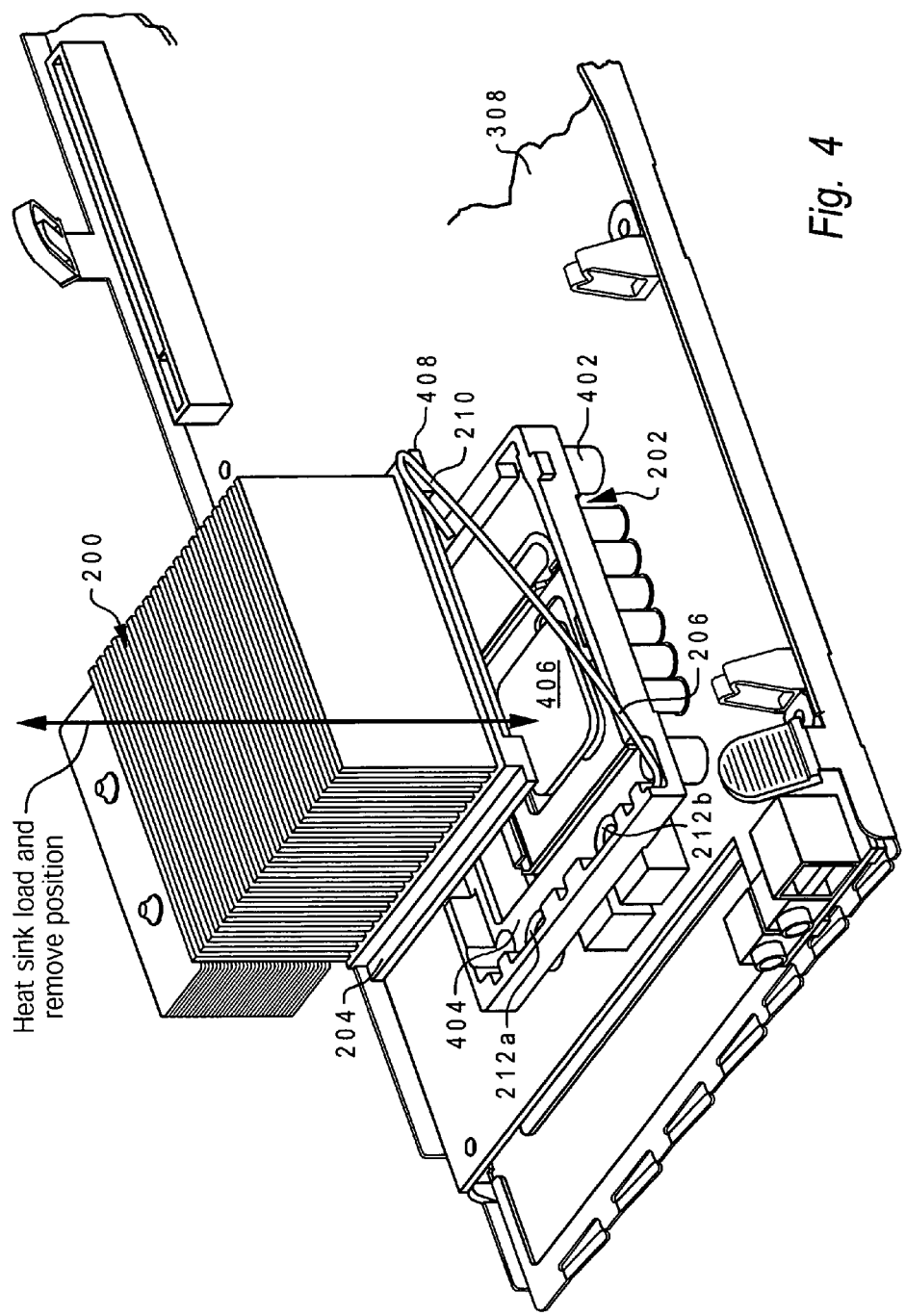
FIG. 4 illustrates an exploded view of the heat sink and retention module.

Referring now to FIG. 4, heat sink 200 is illustrated up and out of retention module 202, but rotatable wire form 206 is not shown as being rotated all the way back. That is, handle 210 is rotatable generally through 90°. When handle 210 is straight up (90°), then wire form first loop 212a and wire form second loop 212b are out of the way of heat sink impingement shelf 204, allowing heat sink 200 to be removed from retention module 202 without obstruction. When handle 210 is pushed down (parallel to a circuit board 308 on which retention module 202 is mounted via retention deck mount legs 402), then wire form first loop 212a and wire form second loop 212b are pressed against heat sink impingement shelf 204, forcing heat sink impingement shelf against a retention deck datum surface 404, thus locking heat sink 200 to retention module 202. Note that retention module 202 is oriented around a computer chip 406, which is preferably mounted to circuit board 308 in a socket (not shown). Computer chip 406 is mounted at a distance away from circuit board 308 such that a top of computer chip 406 presses against a bottom of heat sink 200 when heat sink 200 is locked into retention module 202 by rotating handle 210 downward into a locked position.

Note that at a second end, heat sink 200 has a heat sink retention shelf 408, which extends parallel to and from the bottom surface of heat sink 200 in a similar manner as heat sink impingement shelf 204, but obviously in the opposite direction away from heat sink 200 as that of heat sink impingement shelf 204.

With reference now to FIG. 5, additional detail of retention module 202 without heat sink 202 is shown. Retention module 202 includes rotatable wire form 206 and a retention deck 504. Note that wire form retainment 208 secures rotable wire form 206 to a first end of retention module 202 (specifically retention deck 504), yet allows free rotation up to 90° (and alternatively beyond 90°). Note also capture shelf 306 at a second end of retention module 202. As shown in FIG. 5-A-1, a cross section of a first embodiment of capture shelf 306, described as capture shelf 306-1 and as seen from view lines "A," is a rectangle. This shape allows the top of heat sink retention shelf 408 (shown in FIG. 4) to have a flat surface of contact with the bottom of capture shelf 306. Alternatively, as shown in FIG. 5-A-2, capture shelf 306 can have the cross section shown in FIG. 5-A-2 and depicted as capture shelf 306-2, having a chamfered end. This shape allows heat sink retention shelf 408 to be forced downwards (and thus pushing the bottom of heat sink 200 towards the top of computer chip 406) when heat sink 200 is moved towards the second end of retention module 202' and away from the first end of retention module 202 that has the wire form loops 212.

To achieve this movement of heat sink 200 towards the second end of retention module 202, heat sink impingement shelf 304 is chamfered, as shown in FIG. 6-A. FIGS. 6-A and 6-B show the orientation of heat sink impingement shelf 304 (part of the heat sink 200 and not shown in FIG. 6) between wire form loops 212 and retention deck datum surface 404, as shown when heat sink 200 is being locked down onto retention module 202 (see FIG. 3). Note that in FIG. 6-A, the chamfered end of heat sink impingement shelf 304 causes the force from the downwardly rotating wire form loops 212 to be at an angle such that the force has both vertical and horizontal components. The horizontal component of the force thus "pushes" the heat sink impingement shelf 304, and thus heat sink 200, towards the capture shelf 306 at the second end of the retention module 202. When this horizontal movement of heat sink 200 combines with the alternate cross section of capture shelf 306-2 shown in FIG. 5-A-2, then heat sink 200 is forced downwards. Alternatively, if the horizontal movement of heat sink 200 combines with the cross section of capture shelf 306-1 shown in FIG. 5-A-1, then heat sink 200 is simply slid further under capture shelf 306-1, resulting is a more secure locking, but without additional downward movement of heat sink 200.

Alternatively, heat sink impingement shelf 304 has no chamfering, as shown in FIG. 6-B, in which case all force from wire form loops 212 is downward, resulting in little or no horizontal movement of heat sink 200. However, there will likely be a slight amount of vertical (upward) movement of heat sink 200, causes by the pivotal movement of heat sink 200 about the edge of retention deck datum surface 404. That is, as wire form loops 212 press down on heat sink impingement shelf 304, compression on heat sink impingement shelf 304 can result in the edge of retention deck datum surface 404 to be a fulcrum, resulting in the heat sink retention shelf 408 being pushed upwards against the bottom of capture shelf 306 (see FIGS. 2, 3 and 4 for depictions of elements described here). While this results in a slight reduction in the contact pressure between computer chip 406 and heat sink 200, this is usually minimal, especially if a thermal grease is used between the surfaces of computer chip 406 and heat sink 200.

FIG. 6 also shows a heat sink kick out 602. As rotatable wire form 206 is rotated in a counter-clockwise movement (e.g., handle 210 is lifted up), heat sink kick out 602 catches under heat sink impingement shelf 304, thus kicking heat sink 200 out and up, away from computer chip 406 (see FIG. 4). This feature is especially useful if computer chip 406 had a layer of thermal grease applied before being locked against heat sink 200. Such thermal grease causes a suction grip between the top of computer chip 406 and the bottom of heat sink 200, which is broken by pushing heat sink 200 up and away from computer chip 406 by the movement of heat sink kick out 602 against heat sink impingement shelf 304. In a preferred embodiment, heat sink kick out 602 has a protrusion length and angular orientation from rotatable wire form 206 such that maximum kick-out against heat sink impingement shelf 304 is achieved when handle 210 and wire form second loop 212b are both pointing straight up (90°; vertical). Alternatively, heat sink kick out 602 may have a length and angular orientation such that rotation of rotatable wire form 206 past 90° (in a counter-clockwise motion) result in additional kick-out, assuming of course that wire form retainment 208 permits movement of rotatable wire form 206 beyond 90°.

While the invention has been particularly shown and described with reference to a preferred embodiment, it will be understood by those skilled in the art that various changes in form and detail may be made therein without departing from the spirit and scope of the invention. Furthermore, while terms such as "upward" and "beneath" have been used to describe the spatial orientation and movement of different components, such terms are used generically, and the present invention as described and claimed is to include orientations so generally described, but not limited to such "up/down" definitions. Similarly, while the integrated circuit package being cooled by heat sink 200 has been described as "computer chip 406," it is understood that the present invention is intended to encompass a similar use with any similarly packaged heat generating computer part.

What is claimed is:
1. A system comprising:
   a heat sink having:
     a bottom surface;
     a bottom first end that includes a heat sink impingement shelf, and
     a bottom second end that includes a heat sink retention shelf; and
   a retention module having:
     a retention module first end that includes:
       a retention deck, and
       a rotatable wire form having multiple loops,
     a retention module second end that includes:
       a capture shelf,
wherein upon the heat sink retention shelf being aligned under the capture shelf, the rotatable wire form can be rotated, thus causing the multiple loops to force the heat sink impingement shelf against the retention deck surface, thereby resulting in the bottom surface of the heat sink being pressed against a top surface of a computer chip that is oriented beneath the bottom surface of the heat sink.

2. The system of claim 1, wherein the rotatable wire form has a wire form first loop and a wire form second loop, and wherein the wire form first loop is angularly offset relative to a central axis of the rotatable wire form, such that, when the rotatable wire form is rotated, the wire form first loop makes contact with the heat sink impingement shelf before the wire form second loop makes contact with the heat sink impingement shelf, thereby compensating for a torsion lag between the wire form second loop and the wire form first loop.

3. The system of claim 1, wherein the heat sink impingement shelf has a top chamfered end, such that when the rotatable wire form presses against the top chamfered end, the heat sink is moved towards the retention module second end.

4. The system of claim 3, wherein the capture shelf has a bottom chamfered end, such that the movement of the heat sink towards the retention module second end causes the bottom surface of the heat sink to move towards the top surface of the computer chip.

5. The system of claim 1, further comprising a handle lock stud protruding from a side of the retention module, wherein a handle connected to the rotatable wire form locks under the handle lock stud when the multiple loops press against the heat sink impingement shelf.

6. The system of claim 1, wherein a thermal grease is oriented between the computer chip and the bottom of the heat sink.

7. The system of claim 6, wherein the rotatable wire form further comprises a kick out protrusion, such that when the rotatable wire form is counter-rotated, the kick out protrusion engages against the bottom of the heat sink to break a suction force between the computer chip and the heat sink created by the thermal grease.

8. The system of claim 2, wherein the rotatable wire form further comprises a kick out protrusion, such that when the rotatable wire form is counter-rotated, the kick out protrusion engages against the bottom of the heat sink to push the heat sink away from the computer chip.

9. The system of claim 8, wherein the kick out protrusion is a bend in an end of the rotatable wire form, the bend being offset 90° from the wire form second loop.

* * * * *